(12) United States Patent
Bentley et al.

(10) Patent No.: US 8,322,225 B2
(45) Date of Patent: Dec. 4, 2012

(54) SENSOR PACKAGE ASSEMBLY HAVING AN UNCONSTRAINED SENSE DIE

(75) Inventors: Ian Bentley, New Ipswich, NH (US); Alistair David Bradley, Dublin, OH (US); Jim Cook, Freeport, IL (US)

(73) Assignee: Honeywell International Inc., Morristown, NJ (US)

( * ) Notice: Subject to any disclaimer, the term of this patent is extended or adjusted under 35 U.S.C. 154(b) by 339 days.

(21) Appl. No.: 12/828,155

(22) Filed: Jun. 30, 2010

(65) Prior Publication Data

US 2011/0005326 A1    Jan. 13, 2011

Related U.S. Application Data

(60) Provisional application No. 61/224,837, filed on Jul. 10, 2009.

(51) Int. Cl.
*G01L 9/00* (2006.01)

(52) U.S. Cl. ......................................................... 73/754

(58) Field of Classification Search .................. 73/729.1, 73/706, 754, 726
See application file for complete search history.

(56) References Cited

U.S. PATENT DOCUMENTS

| | | | |
|---|---|---|---|
| 4,942,383 A | 7/1990 | Lam et al. | |
| 4,990,462 A | 2/1991 | Sliwa, Jr. | |
| 5,225,373 A | 7/1993 | Takahashi et al. | |
| 5,257,547 A | 11/1993 | Boyer | |
| 5,327,785 A | 7/1994 | Maurer | |
| 5,410,916 A | 5/1995 | Cook | |
| 5,438,877 A | 8/1995 | Vowles et al. | |
| 5,522,267 A * | 6/1996 | Lewis | 73/726 |
| 5,644,285 A | 7/1997 | Maurer | |
| 5,691,480 A | 11/1997 | Cook, Sr. et al. | |
| 6,025,252 A | 2/2000 | Shindo et al. | |
| 6,058,782 A | 5/2000 | Kurtz et al. | |
| 6,143,673 A | 11/2000 | Jang et al. | |
| 6,148,673 A | 11/2000 | Brown | |
| 6,209,398 B1 | 4/2001 | Fowler, Jr. et al. | |

(Continued)

FOREIGN PATENT DOCUMENTS

EP    0659910    6/1995

(Continued)

OTHER PUBLICATIONS

U.S. Appl. No. 12/616,623, filed Nov. 29, 2009.

(Continued)

*Primary Examiner* — Jewel V Thompson
(74) *Attorney, Agent, or Firm* — Seager Tufte & Wickhem LLC

(57) ABSTRACT

A pressure detection mechanism having a pressure sense die which may be attached directly to a surface of an alumina-based substrate with an adhesive having an optimum thickness. The adhesive may be stress compliant and may be one or more of silicone, silicone-epoxy, epoxy or any other suitable adhesive material. A compensation and interface application specific integrated circuit may be attached to the surface of the package substrate. The pressure sense die may be electrically connected to the integrated circuit with bond wires. The integrated circuit may be electrically connected to trace conductors on the package substrate with bond wires, and trace conductors may be connected to stress compliant metal conductors or leads for external connection to a mounting surface such as a printed circuit board. Hard plastic, or like material, symmetric covers, with one or more pressure ports or vents, may be attached to both sides of the substrate.

21 Claims, 10 Drawing Sheets

U.S. PATENT DOCUMENTS

| | | |
|---|---|---|
| 6,350,630 B1 | 2/2002 | Wildgen |
| 6,577,224 B2 | 6/2003 | Kurtz |
| 6,691,581 B2 | 2/2004 | Kurtz et al. |
| 6,732,588 B1 | 5/2004 | Mullenborn et al. |
| 6,756,248 B2 | 6/2004 | Ikeda et al. |
| 6,756,316 B1 | 6/2004 | Bothra et al. |
| 6,979,872 B2 | 12/2005 | Borwick, III et al. |
| 7,162,927 B1 | 1/2007 | Selvan et al. |
| 7,231,827 B2 | 6/2007 | Kumpfmuller |
| 7,243,552 B2 | 7/2007 | Vas et al. |
| 7,252,007 B2 | 8/2007 | Ruohio et al. |
| 7,290,453 B2 | 11/2007 | Brosh |
| 7,343,080 B2 | 3/2008 | Gally et al. |
| 7,400,042 B2 | 7/2008 | Eriksen et al. |
| 7,430,918 B2 | 10/2008 | Selvan et al. |
| 7,434,474 B1 | 10/2008 | DuPuis |
| 7,462,831 B2 | 12/2008 | Gooch et al. |
| 7,478,562 B2 | 1/2009 | Kurtz et al. |
| 7,538,401 B2 | 5/2009 | Eriksen et al. |
| 7,571,651 B2 | 8/2009 | Kim et al. |
| 7,622,782 B2 | 11/2009 | Chu et al. |
| 7,624,632 B1 | 12/2009 | Hoyle et al. |
| 7,647,835 B2 * | 1/2010 | Speldrich ................ 73/754 |
| 7,654,155 B2 | 2/2010 | Johansen et al. |
| 7,659,610 B2 | 2/2010 | Chen et al. |
| 7,677,109 B2 | 3/2010 | Bentley et al. |
| 7,740,273 B2 | 6/2010 | Breed |
| 7,810,394 B2 | 10/2010 | Yazdi |
| 7,826,267 B2 | 11/2010 | Frayer et al. |
| 8,065,917 B1 * | 11/2011 | Brown et al. ............... 73/706 |
| 2007/0238215 A1 | 10/2007 | Stewart et al. |
| 2007/0279845 A1 | 12/2007 | Kuhnt et al. |
| 2008/0290494 A1 | 11/2008 | Lutz et al. |
| 2009/0288484 A1 | 11/2009 | Selvan et al. |
| 2009/0288492 A1 | 11/2009 | Stewart et al. |
| 2010/0013165 A1 | 1/2010 | Speldrich et al. |
| 2010/0122583 A1 | 5/2010 | Rozgo et al. |
| 2010/0242628 A1 | 9/2010 | Knobloch et al. |
| 2010/0271735 A1 | 10/2010 | Schreiber |
| 2010/0281994 A1 * | 11/2010 | Brown et al. ............... 73/729.1 |
| 2011/0005326 A1 | 1/2011 | Bentley et al. |

FOREIGN PATENT DOCUMENTS

| | | |
|---|---|---|
| EP | 0312532 | 9/1995 |
| JP | 09092670 | 4/1997 |
| JP | 20030130743 | 5/2003 |
| WO | 8602446 | 4/1986 |
| WO | 2008036701 | 3/2008 |
| WO | 2008036705 | 3/2008 |

OTHER PUBLICATIONS

U.S. Appl. No. 12/861,318, filed Aug. 23, 2010.

Honeywell News Release, "Honeywell Introduces Silicon Pressure Sensors That Are the Most Stable Devices Available in the Industry Today, New TruStability Sensors, the HSC and SSC Series, are Designed to Optimize Performance, and Provide Application Flexibility," 1 page, released Jul. 13, 2009.

Honeywell HSC Series Data Sheets, "High Accuracy Pressure Sensors, 1 PSI to 150 PSI, SIP, Digital Output," 11 pages, released Jul. 13, 2009.

Honeywell HSC Series Data Sheets, "High Accuracy Pressure Sensors, 60 mbar to 10 bar, SMT and DIP, Analog Output," 11 pages, released Jul. 13, 2009.

Email Regarding the release date of items 3-5 cited on this IDS, 2 pages, email dated Nov. 15, 2010.

Honeywell, "Installation Instructions for the Compensated and Calibrated Pressure Sensors, XCXL, XCX Series," 2 pages, 2003.

* cited by examiner

SENSOR PACKAGE ASSEMBLY HAVING AN UNCONSTRAINED SENSE DIE

This present application claims the benefit of U.S. Provisional Patent Application No. 61/224,837, filed Jul. 10, 2009, entitled "SENSOR PACKAGE ASSEMBLY HAVING AN UNCONSTRAINED SENSE DIE". U.S. Provisional Patent Application No. 61/224,837, filed Jul. 10, 2009, is hereby incorporated by reference.

BACKGROUND

The application pertains to sensors, and more particularly to sensor packaging.

SUMMARY

The application pertains to sensors, and more particularly to sensor packaging. In some instances, a sensor package is provided that has a package substrate, with a pressure sense die directly mounted to a surface of the package substrate, sometimes with a stress compliant adhesive to result in an effectively unconstrained sense die. In some cases, the package substrate may include one or more traces and/or bond pads that are electrically connected to one or more package leads. The package leads may be suitable for surface mounting the sensor package to a mounting surface such as a printed circuit board or the like. The package leads may be configured to help provide a level of compliance between the substrate and the mounting surface.

DESCRIPTION

Figure 1A:
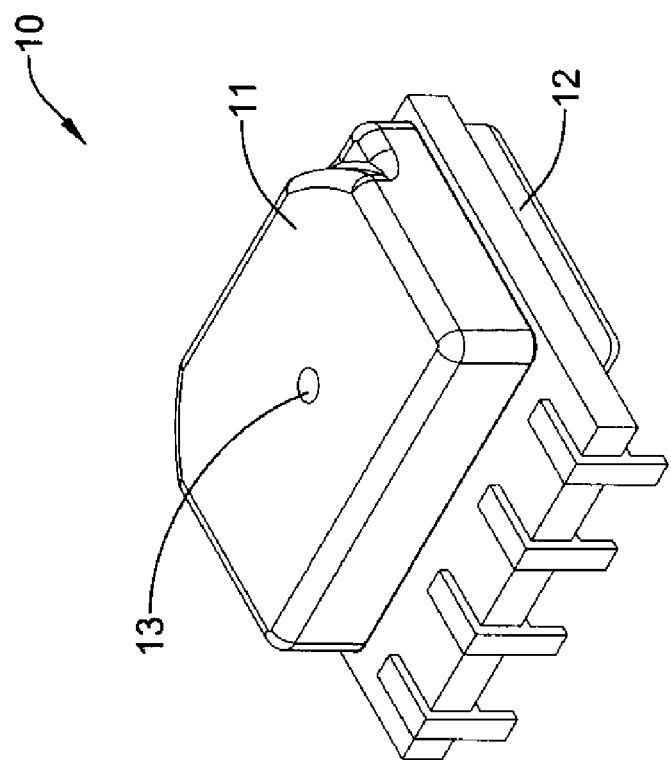
FIGS. 1a-1f is a diagram showing various port and vent configurations for illustrative sensor packages.

There is a long-standing market need for low-cost high-accuracy pressure sensors. Historically, high accuracy sensors have been complex, expensive-to-produce devices.

In particular, for piezo-resistive silicon pressure sense die based sensors, manufacturers have used many different approaches to isolate the sense element from mechanical and thermal stresses. Large packages, constant-temperature chambers, and most particularly isolation layers between the sense die element and the base substrate or package of the larger sensor have been used. These isolation layers are typically one or more layers of silicon or glass bonded to the underside of the silicon sense die element itself. The bond to the sense die element is usually glass frit or an anodic bond. Specialty glasses are often used to closely match the thermal expansion of the silicon sense die.

It has been found that, in some instances, a sense die may be secured directly to a package substrate, without any intervening isolation layer, while still performing acceptably under normal stress conditions. This may provide a smaller package design for the required components, at a reduced cost. Conventional wisdom would dictate that such a configuration would provide a "low accuracy" sensor. In fact, by careful attention to the details of the entire package, it has been found that directly securing the sense die to the package substrate may result in a stable, high accuracy sensor which may be produced at a lower cost.

It has been found that, in some instances, a thicker alumina based ceramic package substrate may be used, and a pressure sense die may be directly attached or glued to the substrate using an RTV, silicone, epoxy, or other suitable adhesive. In some instances, no intervening isolation layers or substrates are provided between the sense die and the package substrate. Thermal and mechanical stresses may be minimized by careful design of the entire package. An ASIC circuit used for compensation may, in some cases, be secured to the package substrate directly beside the pressure sense die, and direct die-to-die wire bonds may be used to minimize package size and the associated mechanical stresses from a larger package. The ceramic substrate itself may be thick relative to its surface area to improve stability. Covers made from plastic, polyamide, ceramic, or another suitable material, may be attached to the substrate on both sides. These covers may be of virtually identical or similar size and shape, not considering ports and vents, and attach to the substrate with the same "footprint" on each side. Electrical connections to the package may be done with compliant metal leads to minimize mounting stress between the package and a mounting surface, such as a printed circuit board.

In some cases, the sensor may have a piezoresistive silicon pressure sense die which is calibrated and temperature compensated for sensor offset, sensitivity, temperature effects and non-linearity using an on-board application specific integrated circuit (ASIC). The sensor may be configured to measure absolute, differential and/or gauge pressures, as desired. An absolute version may have an internal vacuum (or other pressure) reference, and provide an output value proportional to absolute pressure. A differential version may permit application of pressure to both sides of the sensing diaphragm of the sense die. Gauge and compound versions may be referenced to atmospheric pressure and provide outputs proportional to pressure variations relative to the atmosphere.

The sensor package may, in some cases, have width and length dimensions of about 10 mm, and 10 mm or 12.5 mm, respectively. The materials may include high temperature hard plastic, ceramic, polyamide or other suitable material for the covers of the package, alumina ceramic or other suitable material for the package substrate, and silicone, soft or hard epoxy, silicone epoxy, RTV or other suitable material for the adhesive. In some cases, the package substrate may be 96 percent alumina, 99 percent alumina, or any other suitable percent alumina. It is contemplated that the package substrate may be or include other suitable materials, as desired. The electronic components may be composed of ceramic, silicon, glass, gold, solder and other appropriate materials, as desired.

Figure 1B:
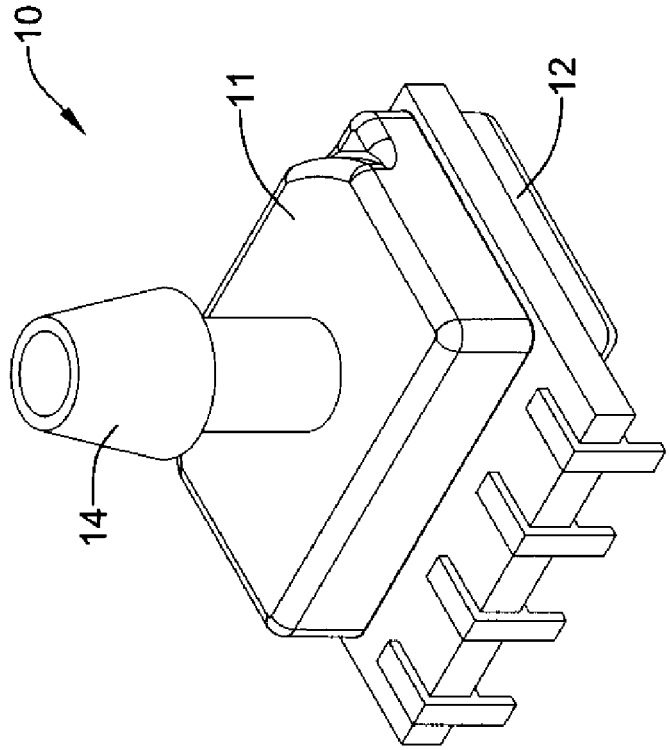
Figure 1C:
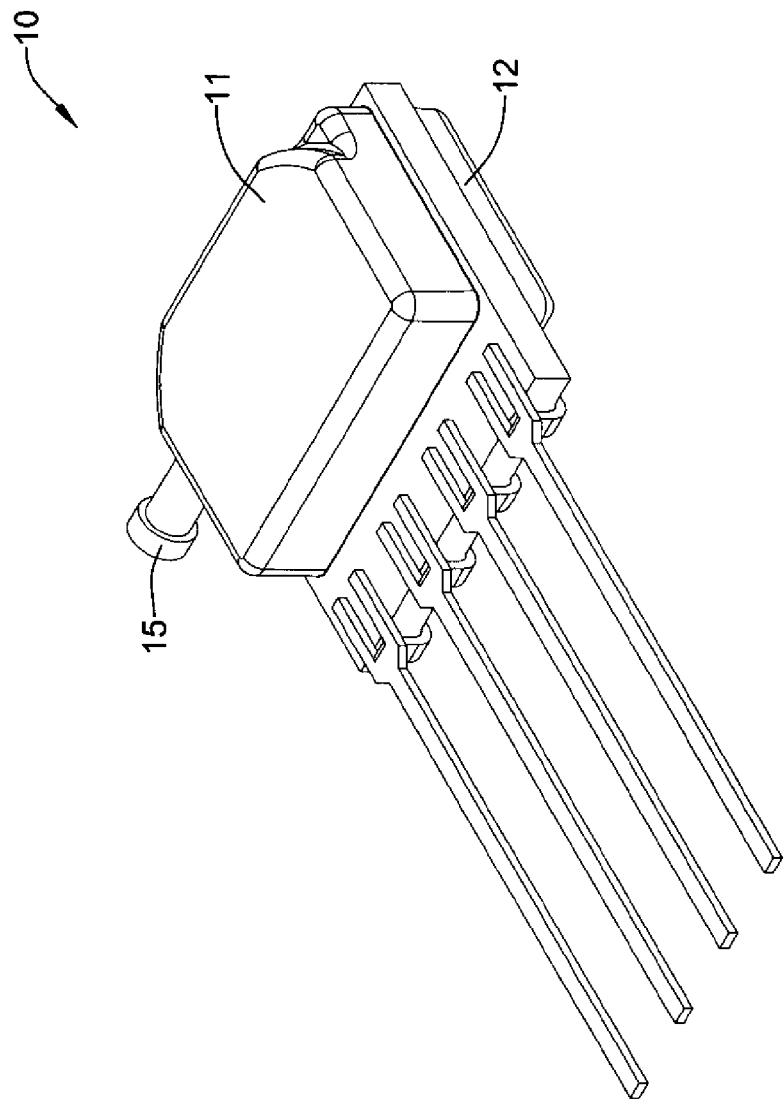
Figure 1D:
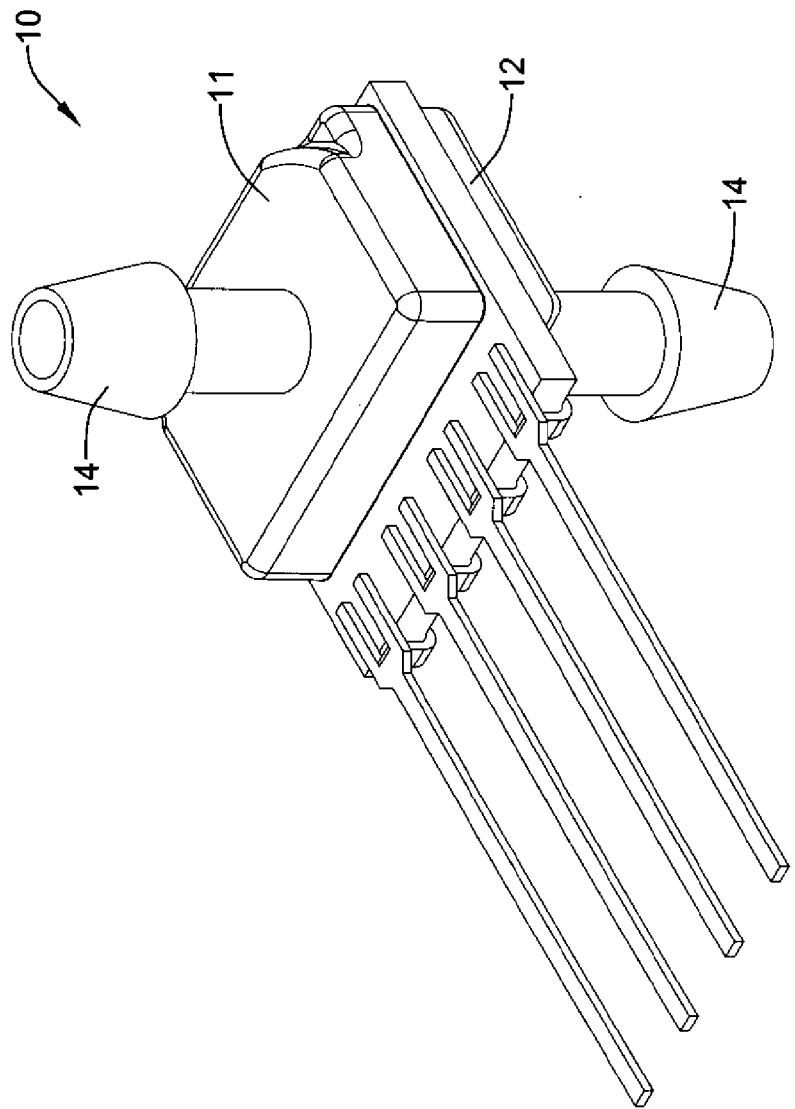
Figure 1E:
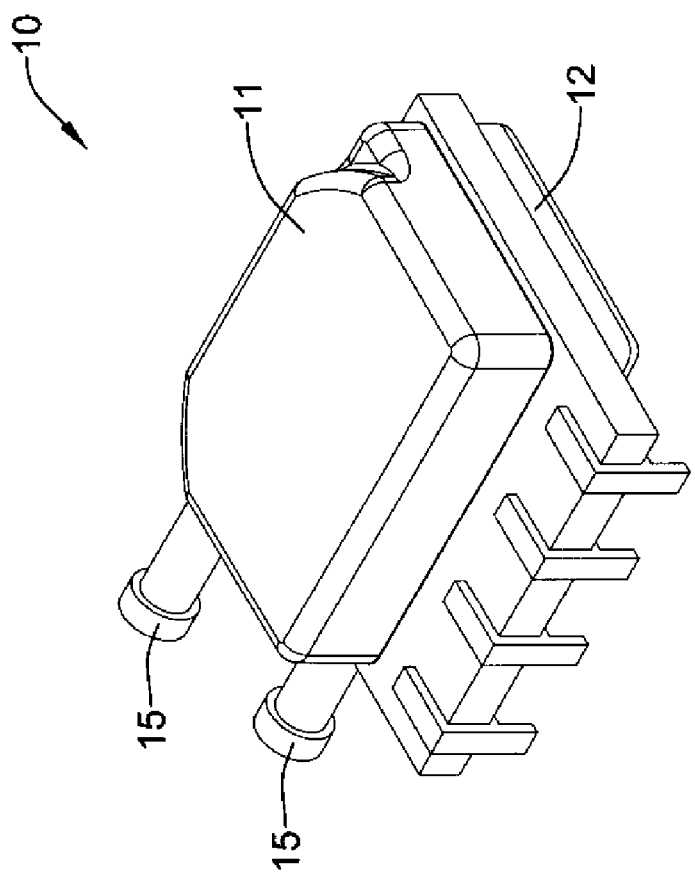
Figure 1F:
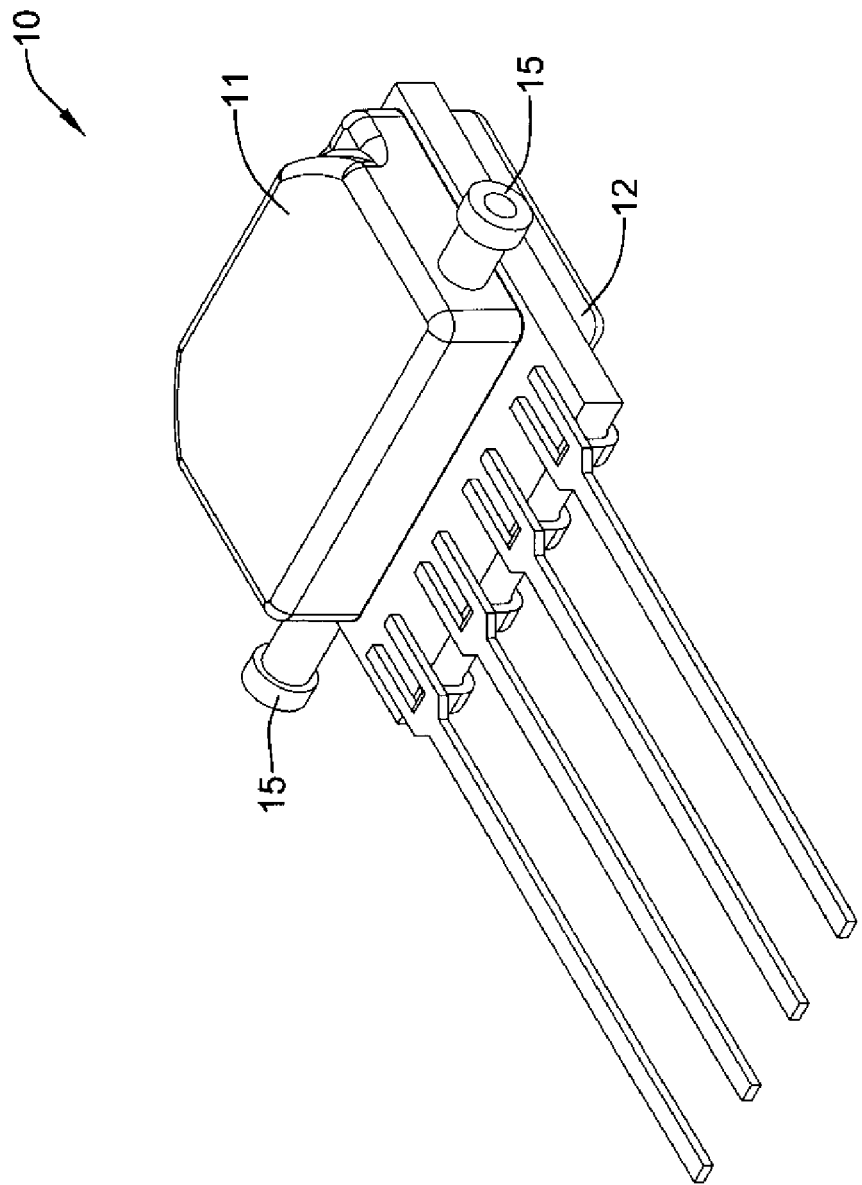

In some cases, the sensor assembly may have various port configurations. FIG. 1a shows a sensor 10 with covers 11 and 12 without a pressure port but may have a pressure vent 13 on cover 11. The sensor may or may not have a pressure vent 13 on cover 12. FIG. 1b shows sensor 10 with an axial pressure port 14 on cover 11. FIG. 1c shows sensor 10 with a radial pressure port 15 on cover 11. FIG. 1d shows sensor with an axial pressure port 14 on cover 11 and an axial pressure port 14 on cover 12. FIG. 1e shows sensor 10 with a radial pressure port 15 on cover 11 and a radial pressure port 15 on cover 12. These radial ports 15 are on the same side. FIG. 1f shows sensor 10 with a radial pressure port 15 on cover 11 and a radial pressure port 15 on cover 12 but these radial ports may be on opposite sides. A combination of various ports may be incorporated in sensor 10. Sensor 10 of FIGS. 1a, 1b and 1e may be situated in a dual inline package (DIP). Sensor 10 of FIGS. 1c, 1d and 1f may be situated in a single inline package (SIP). Either the DIP or SIP may be used for the port configurations in FIGS. 1a through 1f, or any other port configurations. Sensor 10 may be situated in another type of package.

Figure 2:
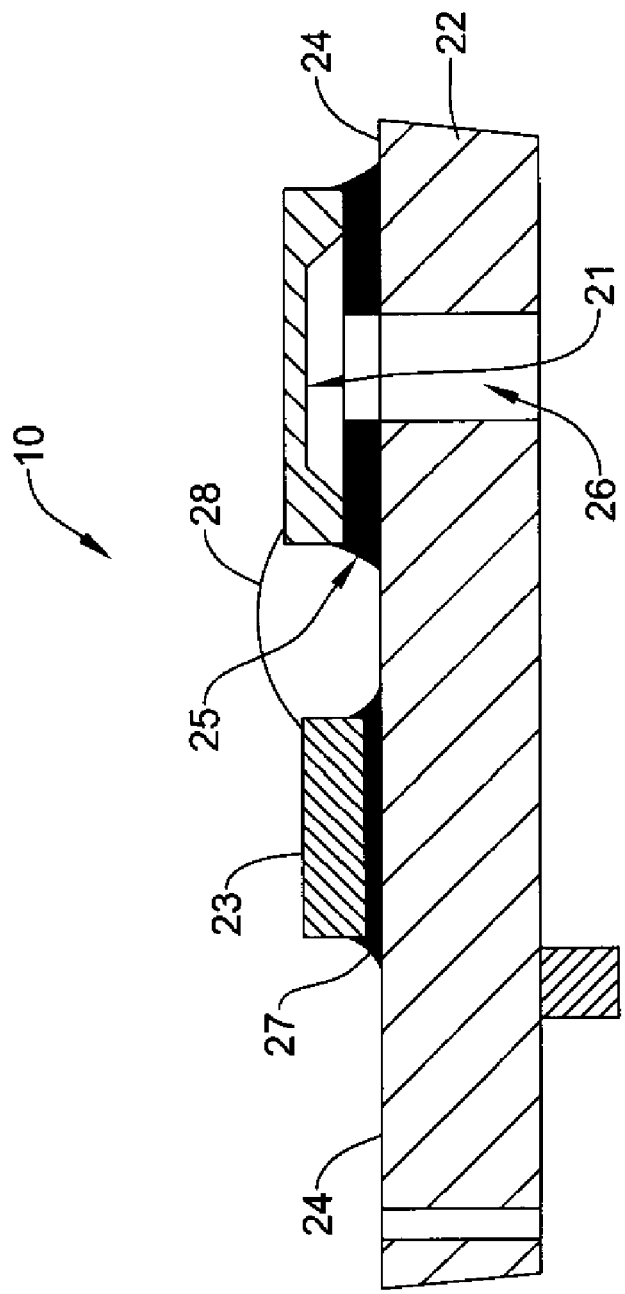
FIG. 2 is a diagram showing a side cut-away view of an illustrative sensor having a pressure sense die directly mounted to a surface of package substrate.
Figure 3:
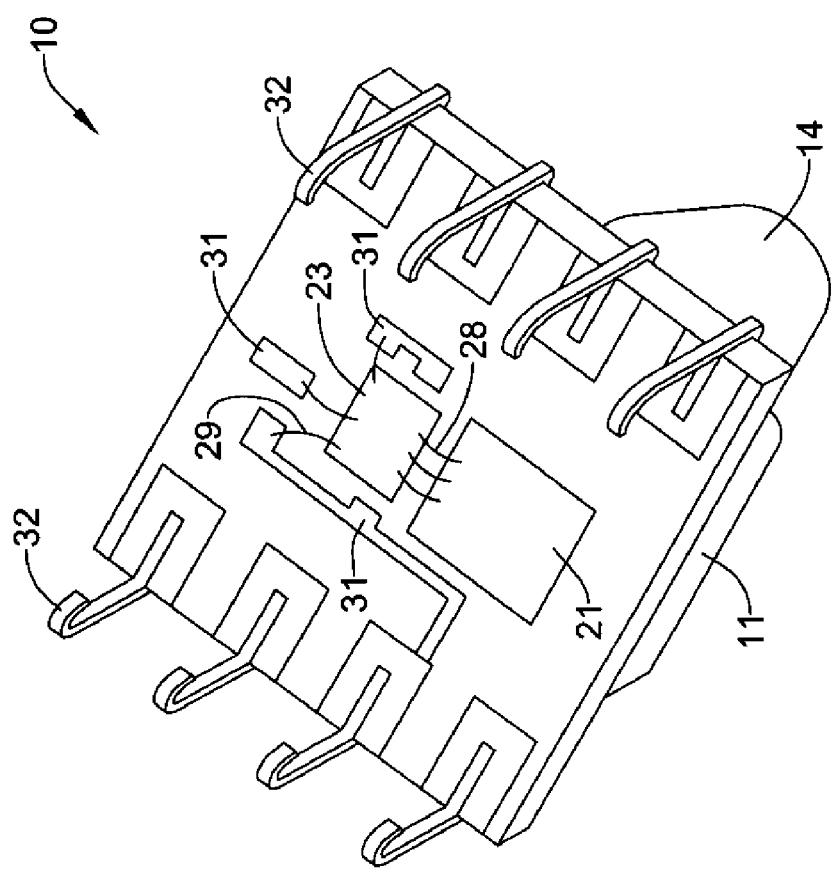
FIG. 3 is a diagram showing a perspective view of an illustrative sensor package substrate, pressure sense die, application specific integrated circuit, bond wires, trace conductors and leads.

FIG. 2 shows a side cut-away view of an illustrative sensor 10 revealing a pressure sense die 21, a package substrate 22 and an ASIC 23. FIG. 3 is a diagram showing a perspective view of an illustrative sensor package substrate, pressure sense die, application specific integrated circuit, bond wires, trace conductors and leads. Pressure sense die 21 may be attached to a side or surface 24 of package substrate 22 with an adhesive 25 such as a silicone, RTV, a silicone-epoxy, a soft epoxy, or a regular or hard epoxy, at an optimum thickness resulting in an effectively stress unconstrained die 21 relative to substrate 22. The latter two adhesives may be more applicable to a high pressure sensor 10 (e.g., over 200 psi or 14 bar). As to an optimum thickness, the thickness of adhesive 25 may be thick enough for adequate adherence of die 21 to substrate 22, but not so thick as to interfere with the bonding or diaphragm of die 21.

In the illustrative example, there is no isolation layer or substrate such as a glass substrate between the pressure sense die 21 and surface 24 of package substrate 22. The adhesive 25 may be relatively thin compared to the sense die 21 and substrate 22. The temperature expansion coefficients of sense die 21 and substrate 22 may be about the same because of the material of the sense die 21 being silicon and the material of package substrate 22 being alumina ceramic. No special effort is necessarily made to select materials for sense die 21 and substrate 22 having temperature expansion coefficients very close to each other. The sense die 21 and substrate 22 may be of materials other than those stated herein.

It may be noted that package substrate 22 may be thicker than typical or conventional package substrates. Package substrate 22 may have, for example, a thickness of one mm and a surface area of 10 mm×10 mm. This would result in an area in square units to thickness in units for a ratio of 100 or a thickness in units to area in square units for a ratio of 0.010. An area-to-thickness ratio for the substrate may be regarded to be equal to or less than 100 square units per linear unit.

The sense die 21 may have piezoresistive components formed on its outer surface for detection of deflection of the sense die diaphragm to indicate pressure differentiation across the diaphragm of die 21. The piezoresistive components may be connected with other detection circuitry in a Wheatstone bridge fashion.

The surface of sense die 21 facing substrate 22 may be sealed by surface 24 of the package substrate, or it may face a hole 26 through the package substrate 22 as shown. The hole may deliver a pressure to sense through the package substrate 22 and to the diaphragm of the sense die 21, when desired.

In some instances, an ASIC 23 may be attached to package substrate 22, sometimes with an adhesive 27. In some cases, adhesive 27 may have the same contents as adhesive 25, but this is not required. ASIC 23 may be an electrical interface and compensation circuit between sense die 21 and connectors or terminals 32 for connections outside of package substrate 22. Sense die 21 may be bond wire 28 connected to ASIC 23. ASIC 23 may be bond-wired 29 connected to trace conductors 31 on the package substrate surface. Trace conductors 31 may be connected to the connectors, leads or terminals 32. The bond wires 28 and 29 and trace conductors 31 may reduce transfer of thermal and mechanical stresses among sense die 21, ASIC 23 and package substrate 22. The outside connectors, leads or terminals 32 of package substrate 22 may be malleable so as to absorb thermal and mechanical stress between substrate 22 and, for example, a printed board (not shown) which sensor 10 might be mounted to.

Figure 4:
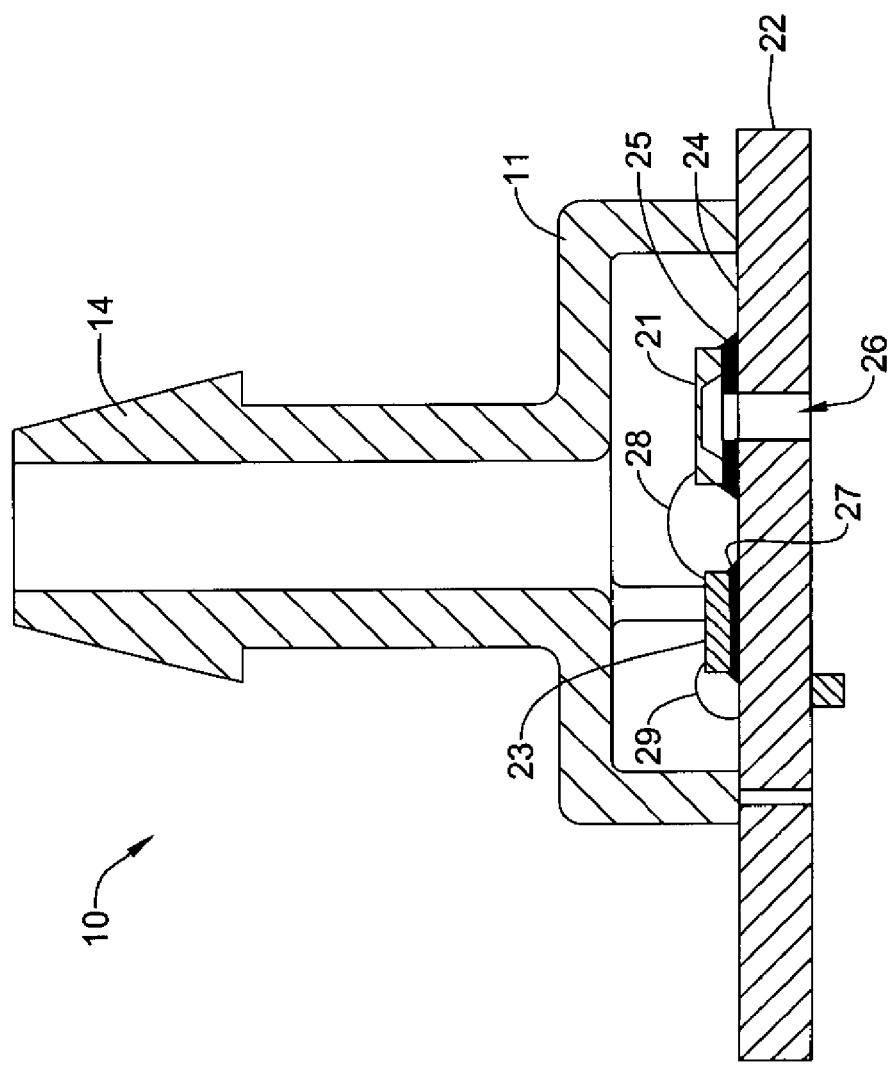
FIG. 4 is a diagram showing a side cut-away view of an illustrative sensor substrate having a pressure sense die, an application specific integrated circuit and a cover with a pressure port mounted on the same side.

FIG. 4 is a diagram showing a side cut-away view of the sensor substrate 22 having a pressure sense die 21, application specific integrated circuit 23 and a cover 11 with a pressure port 14 on the same side of the substrate where the sense die 21 and integrated circuit 23 are situated.

Figure 5:
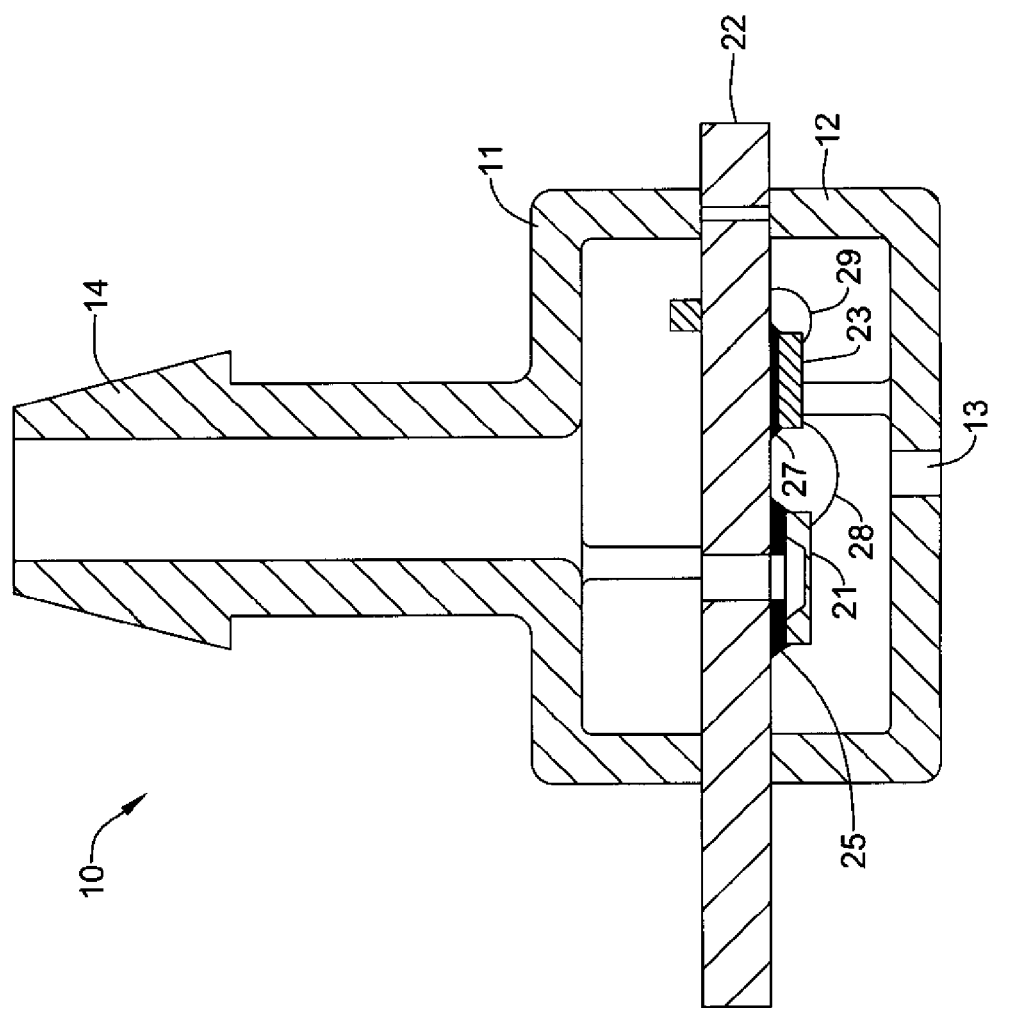
FIG. 5 is a diagram like that of FIG. 4 except showing the sense die, the application specific integrated circuit and a cover with a vent on a side of the substrate opposite of the cover with the port.

FIG. 5 is a diagram like that of FIG. 4 except for showing the sense die 21, integrated circuit 23 and a cover 12 having a vent 13, on a side of the substrate 22 opposite of the cover 11 with port 14.

In the present specification, some of the matter may be of a hypothetical or prophetic in nature although stated in another manner or tense.

Although the disclosed mechanism or approach has been described with respect to at least one illustrative example, many variations and modifications will become apparent to those skilled in the art upon reading the present specification. It is therefore the intention that the appended claims be interpreted as broadly as possible in view of the prior art to include all such variations and modifications.

What is claimed is:

1. A pressure sensor comprising:
a package substrate;
a pressure sense die directly attached to a first side of the package substrate with a stress compliant adhesive;
an application specific integrated circuit electrically connected to the sense die and attached to the first side of the package substrate;
a cover mounted over the first side of the substrate; and
a wire bonding for electrically connecting the pressure sense die to the application specific integrated circuit;
wherein the package substrate has an area-to-thickness ratio less than 100 square units per lineal unit.

2. A pressure detection mechanism comprising:
a package substrate;
a pressure sense die directly attached to a first side of the package substrate with a stress compliant adhesive;
an application specific integrated circuit electrically connected to the sense die and attached to the first side of the package substrate;
a first cover mounted over the first side of the substrate; and
a second cover mounted over a second side of the substrate.

3. The mechanism of claim 2, further comprising:
stress compliant metal leads attached to the package substrate;
trace conductors on the first side of the package substrate electrically connected to the metal leads;
a first wire bonding for electrically connecting the pressure sense die to the application specific integrated circuit; and
a second wire bonding for electrically connecting the application specific integrated circuit to a trace conductor.

4. The mechanism of claim 2, wherein the stress compliant adhesive includes one or more of a silicone material, a silicone-epoxy material and an epoxy material.

5. The mechanism of claim 2, wherein the package substrate comprises an alumina ceramic material.

6. The mechanism of claim 2, wherein the first and second covers have the same footprints along the package substrate.

7. The mechanism of claim 6, wherein the first and second covers are symmetric in shape and size with an exception of a pressure port or vent on at least one of the covers.

8. The mechanism of claim 2, wherein the covers are fabricated from a polyamide material.

9. The mechanism of claim 2, wherein the first and second covers are mounted on the first and second sides, respectively, of the substrate with a stress compliant adhesive.

10. The mechanism of claim 2, wherein:
    the application specific integrated circuit is a compensation circuit for the pressure sense die; and
    the application specific integrated circuit is attached to the package substrate with a stress compliant adhesive.

11. The mechanism of claim 2, wherein the adhesive between the pressure sense die and the package substrate has an optimum thickness.

12. The mechanism of claim 2, wherein the package substrate has an area-to-thickness ratio less than 100 square units per linear unit.

13. The mechanism of claim 2, wherein the pressure sense die comprises one or more Wheatstone bridge piezoresistive stress sensing elements.

14. The mechanism of claim 2, wherein the stress compliant adhesive is the only item between the pressure sense die and the package substrate.

15. The mechanisms of claim 2, wherein the pressure sense die is a silicon MEMS device.

16. The mechanism of claim 2, wherein the package substrate is contained in a package selected from a group consisting of dual-in-line packages, single-in-packages and surface mount packages.

17. The mechanism of claim 2, wherein the package substrate has a hole in an area that corresponds to a diaphragm of the pressure sense die.

18. The mechanism of claim 2, wherein the pressure sense die is bonded directly to the package substrate.

19. A pressure detection mechanism comprising:
    a package substrate; and
    a pressure sense die attached to a first side of the package substrate; and
    wherein the pressure sense die is attached directly to the first side of package substrate with a stress compliant adhesive.

20. The mechanism of claim 19, wherein:
    the stress compliant adhesive comprises a silicone material; and
    the package substrate comprises an alumina-based material.

21. A pressure detection mechanism comprising:
    an alumina-based substrate; and
    a pressure sense die attached to a package substrate with a stress compliant adhesive; and
    wherein no isolation substrate or layer is situated between the pressure sense die and the package substrate.

* * * * *

(12) EX PARTE REEXAMINATION CERTIFICATE (10440th)

United States Patent
Bentley et al.

(10) Number: US 8,322,225 C1
(45) Certificate Issued: Dec. 16, 2014

(54) SENSOR PACKAGE ASSEMBLY HAVING AN UNCONSTRAINED SENSE DIE

(75) Inventors: Ian Bentley, New Ipswich, NH (US); Alistair David Bradley, Dublin, OH (US); Jim Cook, Freeport, IL (US)

(73) Assignee: Honeywell International Inc., Morristown, NJ (US)

Reexamination Request:
No. 90/013,051, Nov. 6, 2013

Reexamination Certificate for:
Patent No.: 8,322,225
Issued: Dec. 4, 2012
Appl. No.: 12/828,155
Filed: Jun. 30, 2010

Related U.S. Application Data

(60) Provisional application No. 61/224,837, filed on Jul. 10, 2009.

(51) Int. Cl.
*G01L 9/00* (2006.01)

(52) U.S. Cl.
USPC .................................. 73/754; 73/706; 73/726

(58) Field of Classification Search
USPC .......... 438/50, 51, 55, 64, 106, 118; 257/414, 257/415, 419
See application file for complete search history.

(56) References Cited

To view the complete listing of prior art documents cited during the proceeding for Reexamination Control Number 90/013,051, please refer to the USPTO's public Patent Application Information Retrieval (PAIR) system under the Display References tab.

*Primary Examiner* — Tuan H Nguyen

(57) ABSTRACT

A pressure detection mechanism having a pressure sense die which may be attached directly to a surface of an alumina-based substrate with an adhesive having an optimum thickness. The adhesive may be stress compliant and may be one or more of silicone, silicone-epoxy, epoxy or any other suitable adhesive material. A compensation and interface application specific integrated circuit may be attached to the surface of the package substrate. The pressure sense die may be electrically connected to the integrated circuit with bond wires. The integrated circuit may be electrically connected to trace conductors on the package substrate with bond wires, and trace conductors may be connected to stress compliant metal conductors or leads for external connection to a mounting surface such as a printed circuit board. Hard plastic, or like material, symmetric covers, with one or more pressure ports or vents, may be attached to both sides of the substrate.

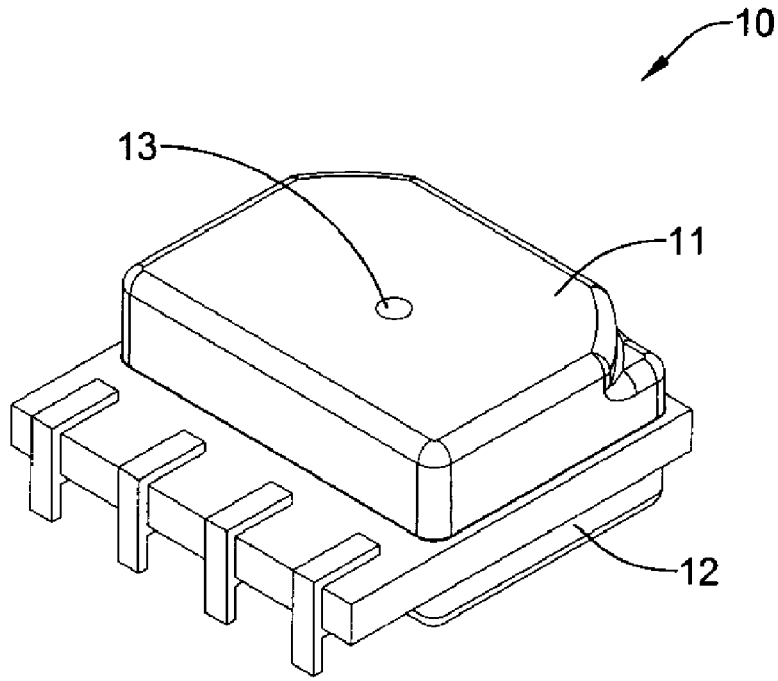

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 19 and 21 are determined to be patentable as amended.

New claims 22-62 are added and determined to be patentable.

Claims 1-18 and 20 were not reexamined.

19. A pressure detection mechanism comprising:
   a *ceramic* package substrate; [and]
   a pressure sense die attached to a first side of the *ceramic* package substrate; [and]
   *an application specific integrated circuit (ASIC) electrically connected to the pressure sense die;*
   *a first package cover positioned over the pressure sense die and the ASIC and attached to the first side of the ceramic package substrate; and*
   a second package cover attached to a second side of the ceramic package substrate opposite the first side, the second package cover having a similar size and shape as the first package cover and also having a same footprint along the ceramic package substrate as the first package cover;
   wherein the pressure sense die is attached directly to the first side of *the ceramic* package substrate with a stress compliant adhesive, *and*
   *the ASIC is attached to the first side of the ceramic package substrate with an adhesive different than the stress compliant adhesive.*

21. A pressure detection mechanism comprising:
    an alumina-based *package* substrate [and] *comprising trace conductors on a first side of the alumina-based package substrate*;
    a pressure sense die attached to [a] *the first side of the alumina-based* package substrate with a stress compliant adhesive; [and]
    *an application specific integrated circuit (ASIC) attached to the first side of the alumina-based package substrate,*
    *wherein the ASIC is electrically connected to the trace conductors with bond wires, and*
    wherein no isolation substrate or layer is situated between the pressure sense die and the *alumina-based* package substrate.

22. *A pressure detection mechanism comprising:*
    *a ceramic package substrate having a trace conductor;*
    *a pressure sense die attached directly to a first side of the ceramic package substrate with a stress compliant adhesive;*
    *an application specific integrated circuit (ASIC) attached to the first side of the ceramic package substrate;*
    *a first package cover positioned over the pressure sense die and the ASIC and attached to the first side of the ceramic package substrate, the first package cover comprising a first port;*
    *a second package cover attached to a second side of the ceramic package substrate opposite the first side, the second package cover having a same footprint along the ceramic package substrate as the first package cover, the second package cover comprising a vent or a second port;*
    *a first wire bond electrically connecting the pressure sense die to the ASIC; and*
    *a second wire bond electrically connecting the ASIC to the trace conductor.*

23. *The pressure detection mechanism of claim 22, wherein the ceramic package substrate extends beyond a perimeter of the first package cover and the second package cover, and wherein the first package cover defines a single enclosure cavity and both the pressure sense die and the ASIC are positioned in the single enclosure cavity.*

24. *The pressure detection mechanism of claim 22, wherein the trace conductor is on the first side of the ceramic package substrate and the ASIC is a compensation circuit for the pressure sense die.*

25. *The pressure detection mechanism of claim 22, wherein the ASIC is attached to the first side of the ceramic package substrate with an adhesive different than the stress compliant adhesive, a thickness of the stress compliant adhesive is greater than a thickness of the adhesive attaching the ASIC to the first side of the ceramic package substrate, and a thickness of the ceramic package substrate is greater than the thickness of the stress compliant adhesive and the thickness of the adhesive attaching the ASIC to the first side of the ceramic package substrate.*

26. *The pressure detection mechanism of claim 22, wherein the ASIC is attached to the first side of the ceramic package substrate with an adhesive that does not have a same contents as the stress compliant adhesive.*

27. *The pressure detection mechanism of claim 26, wherein a thickness of the stress compliant adhesive is greater than a thickness of the adhesive attaching the ASIC to the first side of the ceramic package substrate.*

28. *The pressure detection mechanism of claim 26, wherein a thickness of the ceramic package substrate is greater than the thickness of the stress compliant adhesive and the thickness of the adhesive attaching the ASIC to the first side of the ceramic package substrate.*

29. *The pressure detection mechanism of claim 22, wherein the stress compliant adhesive comprises one or more of silicone, silicone-epoxy, and epoxy.*

30. *The pressure detection mechanism of claim 22, wherein temperature expansion coefficients of the pressure sense die and the ceramic package substrate are about the same.*

31. *The pressure detection mechanism of claim 22, wherein the ceramic package substrate has a hole in an area that corresponds to a diaphragm of the pressure sense die.*

32. *The pressure detection mechanism of claim 22, wherein the first package cover and the second package cover have a virtually identical size and shape.*

33. *The pressure detection mechanism of claim 22, wherein the first package cover and the second package cover are symmetric in shape and size with an exception of the vent or second port.*

34. *The pressure detection mechanism of claim 22, wherein one of the first port is radial and the second port or vent is radial.*

35. The pressure detection mechanism of claim 22, wherein both the first port and the second port or vent are radial.

36. The pressure detection mechanism of claim 22, wherein the first package cover and the second package cover comprise one of a plastic, a ceramic, and a polyamide.

37. The pressure detection mechanism of claim 22, wherein one of the first port is axial and the second port or vent is axial.

38. The pressure detection mechanism of claim 22, wherein the first port provides an opening that is offset relative to a diaphragm of the pressure sense die.

39. The pressure detection mechanism of claim 22, wherein the first package cover defines a single enclosure cavity and both the pressure sense die and the ASIC are positioned in the single enclosure cavity.

40. The pressure detection mechanism of claim 22, wherein the ceramic package substrate extends beyond a perimeter of the first package cover and the second package cover.

41. The pressure detection mechanism of claim 22, wherein the ASIC is a compensation circuit for the pressure sense die.

42. The pressure detection mechanism of claim 41, wherein the ASIC is configured to calibrate and temperature compensate the pressure sense die.

43. The pressure detection mechanism of claim 42, wherein the ASIC is configured to calibrate and temperature compensate for sensor offset, sensitivity, temperature effects, and non-linearity.

44. The pressure detection mechanism of claim 22, wherein the pressure sense die is configured to measure over 200 psi of pressure.

45. The pressure detection mechanism of claim 22, wherein the pressure sense die is configured to measure absolute pressure.

46. The pressure detection mechanism of claim 22, wherein the pressure sense die is configured to measure gauge pressure.

47. The pressure detection mechanism of claim 22, wherein the pressure sense die is a silicon MEMS device.

48. The pressure detection mechanism of claim 22, wherein the pressure sense die comprises one or more Wheatstone bridge piezoresistive stress sensing elements.

49. The pressure detection mechanism of claim 22, further comprising leads attached to the ceramic package substrate.

50. The pressure detection mechanism of claim 49, wherein the leads are longer than a combined thickness of the first package cover and the ceramic package substrate.

51. The pressure detection mechanism of claim 49, wherein the first package cover and the second package cover are rectangular shaped and the leads comprise two parallel rows of electrical leads extending along a longer side of the covers.

52. The pressure detection mechanism of claim 49, wherein the leads are configured for surface mounting to a printed circuit board.

53. The pressure detection mechanism of claim 49, wherein the leads are stress compliant metal leads.

54. The pressure detection mechanism of claim 22, wherein the pressure detection mechanism is configured to covert a static pressure difference between a first fluid media and a second fluid media to an electrical signal, the first port is configured to fluidly couple a first side of the pressure sense die and the ASIC to the first fluid media, and the second package cover comprises the second port, the second port being configured to fluidly couple a second side of the pressure sense die to the second fluid media.

55. The pressure detection mechanism of claim 22, wherein the pressure sense die is a single-cavity pressure sense die.

56. A pressure detection mechanism comprising:

a package substrate comprising an alumina ceramic material and having a trace conductor;

a pressure sense die attached directly to a first side of the package substrate with a stress compliant adhesive;

an application specific integrated circuit (ASIC) attached to the first side of the package substrate;

a first cover positioned over the pressure sense die and the ASIC and attached to the first side of the package substrate;

a second cover attached to a second side of the package substrate opposite the first side, the second cover having a same footprint along the package substrate as the first cover;

a first wire bond electrically connecting the pressure sense die to the ASIC; and a second wire bond electrically connecting the ASIC to the trace conductor.

57. The pressure detection mechanism of claim 56, wherein the alumina ceramic material comprises one of 96 percent alumina or 99 percent alumina.

58. A pressure detection mechanism comprising:

a ceramic package substrate;

a pressure sense die attached directly to a first side of the ceramic package substrate with a stress compliant adhesive;

a first package cover positioned over the pressure sense die and an application specific integrated circuit (ASIC) and attached to the first side of the ceramic package substrate, the first package cover comprising a port to fluidly couple a first side of the pressure sense die to a fluid media being sensed; and a second package cover attached to a second side of the ceramic package substrate opposite the first side, the second package cover having a same footprint along the ceramic package substrate as the first package cover.

59. A pressure detection mechanism comprising:

a ceramic package substrate;

a pressure sense die attached directly to a first side of the ceramic package substrate with a stress compliant adhesive;

a first package cover positioned over the pressure sense die and attached to the first side of the ceramic package substrate within a single enclosure cavity, the first package cover comprising a port or vent; and a second package cover attached to a second side of the ceramic package substrate opposite the first side, the second package cover defining a single enclosure cavity having a similar size and shape as the first package cover and also having a same footprint along the ceramic package substrate as the first package cover, wherein an application specific integrated circuit (ASIC) is attached to the first side of the ceramic package substrate with an adhesive different than the stress compliant adhesive, a thickness of the stress compliant adhesive is greater than a thickness of the adhesive attaching the ASIC to the first side of the ceramic package substrate, and a thickness of the ceramic package substrate is greater than the thickness of the stress compliant adhesive and the thickness of the adhesive attaching the ASIC to the first side of the ceramic package substrate.

60. A pressure detection mechanism for converting a static pressure difference between a first fluid media and a second fluid media to an electrical signal, the pressure detection mechanism comprising:
  a ceramic package substrate;
  a single-cavity pressure sense die attached directly to a first side of the ceramic package substrate with a stress compliant adhesive;
  an application specific integrated circuit (ASIC) attached to the first side of the ceramic package substrate and electrically connected to the pressure sense die;
  a first package cover positioned over the pressure sense die and the ASIC within a single enclosure cavity, and attached to the first side of the ceramic package substrate, the first package cover comprising a first port to fluidly couple a first side of the pressure sense die and the ASIC to the first fluid media;
  a second package cover attached to a second side of the ceramic package substrate opposite the first side, the second package cover having a same footprint along the ceramic package substrate as the first cover, the second package cover comprising a second port to fluidly couple a second side of the pressure sense die, the second side being opposite the first side, to the second fluid media;
  a first wire bond electrically connecting the pressure sense die to the ASIC; and
  a second wire bond electrically connecting the ASIC to the trace conductor.

61. A pressure detection mechanism comprising:
  a ceramic package substrate having a trace conductor;
  a pressure sense die attached directly to a first side of the ceramic package substrate with a stress compliant adhesive;
  an application specific integrated circuit (ASIC) attached to the first side of the ceramic package substrate;
  a first package cover positioned over the pressure sense die and the ASIC and attached to the first side of the ceramic package substrate;
  a second package cover attached to a second side of the ceramic package substrate opposite the first side, the second package cover having a same footprint along the ceramic package substrate as the first package cover;
  a first wire bond electrically connecting the pressure sense die to the ASIC; and
  a second wire bond electrically connecting the ASIC to the trace conductor.

62. The pressure detection mechanism of claim 61, wherein at least one of the first package cover and the second package cover comprises a first port and the other of the first package cover and the second package cover comprises a vent or a second port.

* * * * *